(12) United States Patent
Desai

(10) Patent No.: US 6,265,924 B1
(45) Date of Patent: Jul. 24, 2001

(54) NON-UNIFORM DELAY STAGES TO INCREASE THE OPERATING FREQUENCY RANGE OF DELAY LINES

(75) Inventor: Chintan Desai, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/468,711

(22) Filed: Dec. 21, 1999

(51) Int. Cl.[7] .................................................. H03K 5/13
(52) U.S. Cl. ........................................... 327/276; 327/277
(58) Field of Search .................................... 327/261, 270, 327/271, 277, 284, 276

(56) References Cited

U.S. PATENT DOCUMENTS 5,834,960 * 11/1998 Heima et al. ........................ 327/277

* cited by examiner

Primary Examiner—Dinh T. Le

(57) ABSTRACT

A delay line provides a variable delay in the clock path and increases the operating frequency range through the use of delay stages which have non-uniform propagation delay with respect to one another. The range of operating frequency is increased by keeping the delay stages with the minimum propagation delay in the center of the delay line while the delay stages with the maximum propagation delay are toward the ends of the delay line.

10 Claims, 3 Drawing Sheets

NON-UNIFORM DELAY STAGES TO INCREASE THE OPERATING FREQUENCY RANGE OF DELAY LINES

BACKGROUND OF THE INVENTION

1. Field of the Invention

The present invention is generally directed to tracking data using clock recovery modules in various data transmission applications such as transceivers using transmit and receive chips. More specifically, the present invention is directed to delay lines which operate over an increased frequency range in adjusting the effective delay in the clock path of a local clock.

2. Background

Clock recovery circuits track incoming data by properly aligning a local clock edge with the data transition edge. Alignment requires constant adjustment of the clock which is achieved by adding and reducing delay in the clock path. However, clock recovery architecture demands adherence to certain constraints which limit the operating frequency range of delay lines.

The first constraint is under a worst case (WC) process-voltage-temperature (PVT) condition occurring when the frequency of operation is at a maximum. A weak process, a low voltage and a high temperature make up a worst case condition which results in slow running logic. The delay of a single delay stage comprised of standard gates can vary as much as 2.5 times from one PVT extreme to another. For example, if the delay through one delay stage is 200 pico-seconds in the best case (BC) PVT condition, it would be 500 pico-seconds in the worst case PVT condition. The first constraint, (A), under the worst case condition demands that there be at least six elements or delay stages in the clock path in order to generate a delay of half a clock period at the maximum frequency of operation. In effect, the delay per stage should not exceed $1/12^{th}$ of the clock period. The maximum frequency is thus represented by the following relationship:

$$\text{Max. Frequency} = 1/[(\# \text{ of delay stages}) \times (\text{WC stage delay}) \times (2)] \quad (A)$$

or $$\text{Max. Frequency} = 1/[(6) \times (\text{WC stage delay}) \times (2)]$$

Constraint (A) is necessary because when the delay through a single delay stage becomes a considerable portion of the clock period, the clock pulse will shrink so significantly when the delay stage is inserted or removed from the clock path that the clock pulse may eventually be completely lost at the end of the delay line. In addition, switching large single delay stages in and out of the clock path contributes to clock jitter.

The second constraint is under a best case (BC) PVT condition occurring when the frequency of operation is at a minimum. A best case condition results in fast running logic and arises from a strong process, a high voltage and a low temperature. The second constraint, (B), dictates that the delay line should generate a total delay of at least one half of the clock period in the best case condition at the minimum frequency. The minimum frequency is thus represented by the following relationship:

$$\text{Min. Frequency} = 1/[(\# \text{ of delay stages}) \times (\text{BC stage delay}) \times (2)] \quad (B)$$

Prior methods used in previous generations of products for adding and reducing delay in clock paths include the use of delay cells which are repeated several times to form a delay chain. The delay chain can be reconfigured to alter the path of the clock, thereby changing the amount of delay in the clock path. As illustrated by the four-stage delay line of FIG. 1, the clock path delay can be increased by shifting the four-bit digital select control, sel[3:0], from 0001 to 1000 and vice versa.

However, this and other prior methods have limited operating frequency ranges because they use identical delay stages in the delay chain. For example, where a single delay stage comprised of standard gates varies as much as 2.5 times from one PVT extreme to another, and the delay through a single delay stage is 200 pico-seconds in the best case and 500 pico-seconds in the worst case, the operating frequency range determined using the prior constraints (A) and (B) in a sixteen stage delay line is as follows:

$$\text{Max. Frequency} = 1/[(6) \times (500 \text{ ps}) \times (2)] = 166 \text{ Mhz} \quad (A)$$

$$\text{Min. Frequency} = 1/[(16) \times (200 \text{ ps}) \times (2)] = 156 \text{ Mhz} \quad (B)$$

This is a very narrow operating frequency range for the delay line, and increasing the range by extending the lower frequency margin would require adding more delay stages. This increases the necessary surface area and more importantly requires a redesign of the control logic controlling selection of the delay stages.

An alternative method for increasing the operating frequency range of delay lines involves the design of custom delay elements which have relatively small delay variation over PVT extremes. It is apparent from the maximum and minimum frequency equations for constraints (A) and (B) respectively, that a delay chain using identical elements designed in this manner would result in an increased operating frequency range for the delay line as the variation between the best case delay and the worst case delay would be minor. However, this method requires tightly controlled analog circuit design and results in a circuit which consumes more power.

Accordingly, there exists a need for an efficient, simple and inexpensive method for adding or reducing delay in a clock path.

SUMMARY OF THE INVENTION

A delay line provides a variable delay in the clock path and increases the operating frequency range through the use of delay stages which have non-uniform propagation delay with respect to one another. The range of operating frequency is increased by keeping the delay stages with the minimum propagation delay in the center of the delay line while the delay stages with the maximum propagation delay are toward the ends of the delay line.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons having the benefit of this disclosure.

Figure 2:
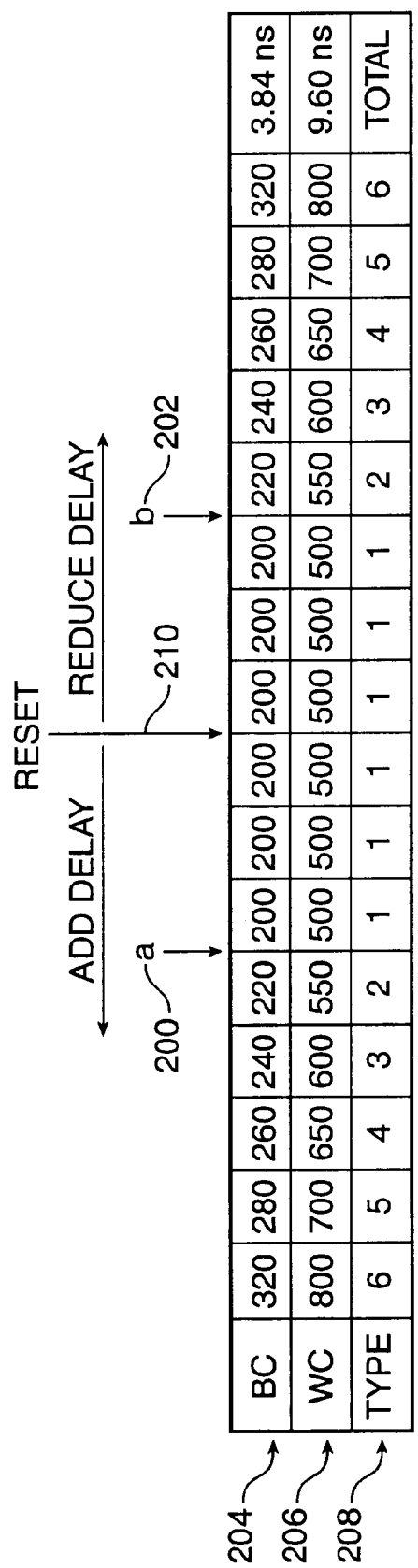
FIG. 2 is a delay table illustrating the non-uniform delay stages used in accordance with a preferred embodiment of the present invention.

A preferred embodiment of the method of the present invention is illustrated by the sixteen stage, non-uniform delay table of FIG. 2. The delay table of FIG. 2 depicts a delay line having non-uniform delay stages where stages having the minimum propagation delay are in the center of the delay line between pointers "a" 200 and "b" 202 and stages having greater propagation delays are toward the ends of the delay line, outside of pointers "a" 200 and "b" 202. Each delay stage in the table is represented by its own delay in pico-seconds under best case (BC) 204 and worst case (WC) 206 process-voltage-temperature (PVT) conditions. The sixteen stages consist of six different types 208 of delay stages with increasing propagation delays from type one through six.

Figure 1:
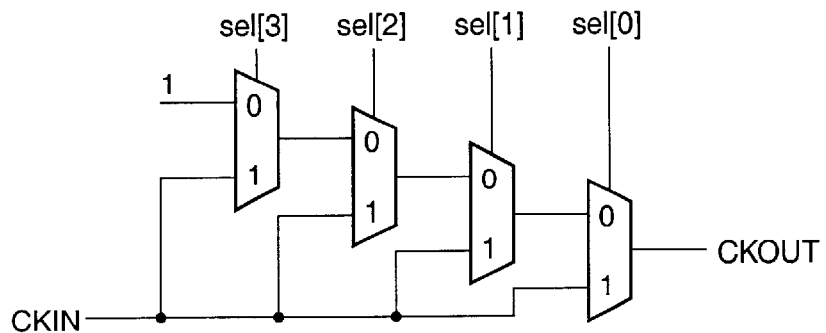
FIG. 1 is a block diagram of a typical four stage delay line in accordance with the prior art.
Figure 3:
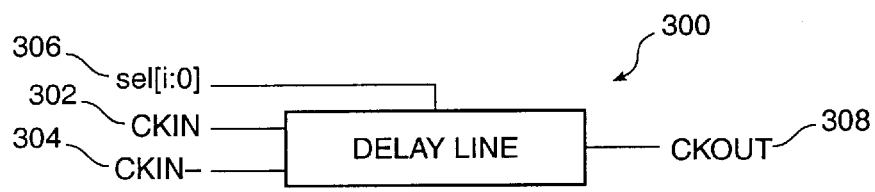
FIG. 3 is a block diagram illustrating the modular pinouts of a delay line in accordance with a preferred embodiment of the present invention.

A preferred embodiment of a modular pinout of the delay line of the present invention is illustrated in FIG. 3. The delay line 300 has a non-inverted clock input 302, an inverted clock input 304, a delay element input select 306, and a clock output 308. The clock output 308 is non-inverting and the delay from the non-inverting clock input 302 to the clock output 308 is controlled by the select inputs 306. Each bit on the select input 306 line maps to one of the delay elements within the delay line 300. For example, in a four-stage delay line 300, the clock path through the delay line 300 can be made to include one, two, three, or four stages of delay when the select input 306 is driven by a shift register that shifts a "1" from sel[0] (0001) to sel[3] (1000).

Figure 4:
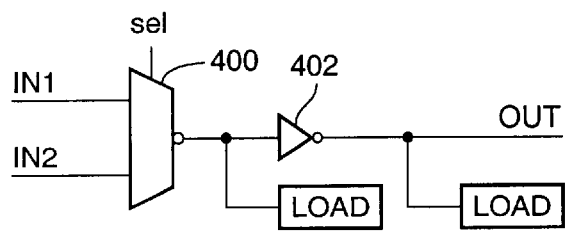
FIG. 4 is a block diagram illustrating functional components within a delay line in accordance with a preferred embodiment of the present invention.
Figure 5:
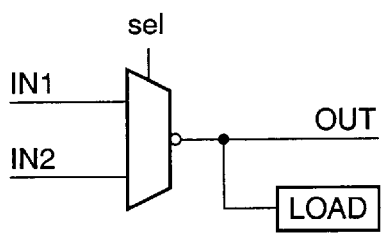
FIG. 5 is a block diagram illustrating functional components within a delay line in accordance with a preferred embodiment of the present invention.

The delay line 300 as represented in FIG. 3, functionally consists of delay elements which typically include a multiplexer 400 and an inverter 402 in series as illustrated in the non-inverting delay stage of FIG. 4. However, lower propagation delays are difficult to achieve with the non-inverting delay stage of FIG. 4, so an inverting stage such as is shown in FIG. 5 may also be used in the delay line 300. Since both inverting and non-inverting delay stages are used in the delay line 300, the clock output 308 could be inverting or non-inverting based on whether even or odd numbers of inverting stages are included in the effective delay path. Therefore, the delay line 300 has both a non-inverting clock input 302 and an inverting clock input 304 as shown in FIG. 3. Increased delay throughout the non-uniform delay stages can be easily achieved by adding buffers and/or internal loads once the minimum delay stage is optimized for the maximum operating frequency and the worst case PVT operating condition.

Referring again to FIG. 2, upon initialization of the circuit, a selection is made to insert half of the delay line in the clock path upon reset as shown by the pointer 210. The delay on the clock path is alternately reduced and increased by moving the pointer 210 to the right and to the left through the select input 306 control shown in FIG. 3. When operating at maximum frequency (e.g. 166 Mhz as in the prior example) and the worst case (WC) PVT operating condition, moving the pointer 210 between "a" 200 and "b" 202 generates a delay differential of (500 pico-seconds)×(6)=3 nano-seconds. This is approximately one half of the clock period (T=1/166 Mhz=6 ns) which satisfies constraint (B), that the delay line should generate a total delay of at least one half of the clock period. Therefore, at maximum frequency and worst case operating conditions, only the type 1 208 delay stages will be in use, as illustrated by the delay line range shown in FIG. 6. This scenario also satisfies constraint (A), that the delay per stage should not exceed $\frac{1}{12}^{th}$ of the clock period.

Figure 6:
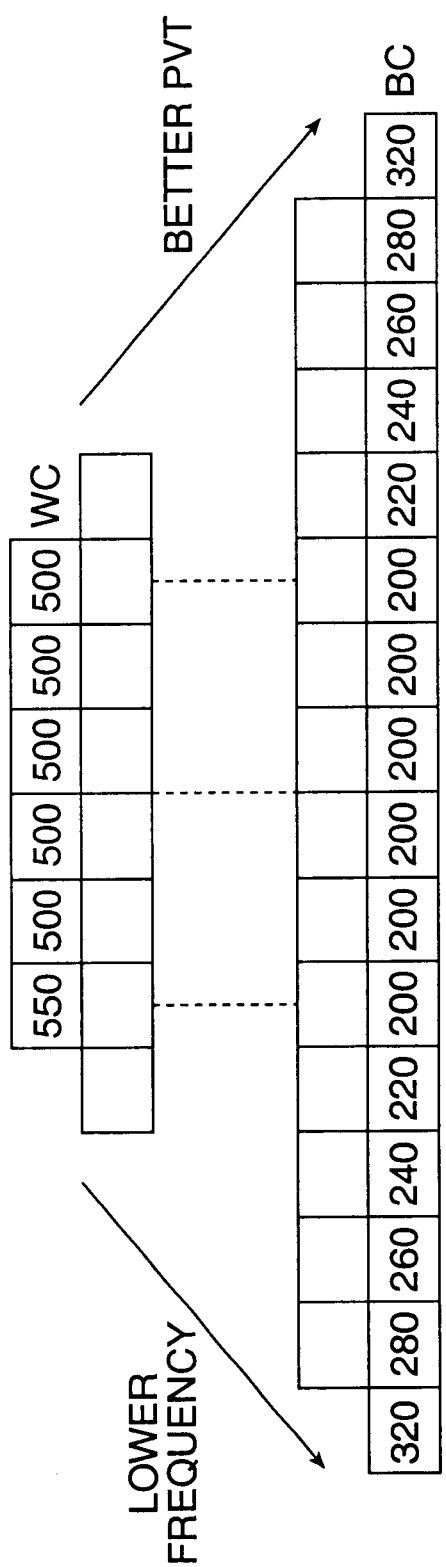
FIG. 6 is a delay table illustrating the range of delay stages used over operating extremes within a delay line in accordance with a preferred embodiment of the present invention.

As further illustrated by the delay line range shown in FIG. 6, when the PVT operating conditions improve or the frequency of the clock gets slower, more than six delay stages will be in use, and the pointer 210 of FIG. 2 will move to the right of "b" 202 and the left of "a" 200 in order to generate enough delay to satisfy constraint (B). Since this can only happen under improved PVT conditions or a lower clock frequency, it is apparent that the delay per any one stage will not exceed $\frac{1}{12}^{th}$ of the clock period, thereby also satisfying constraint (A).

The delay line effectively works as a six to sixteen stage delay line from one PVT/frequency extreme to the other while meeting both constraint (A) and (B). In the best case extreme, the delay table of FIG. 2 shows how the total delay that can be generated over the sixteen delay stages is 3.84 nano-seconds. Using constraint (B), the minimum operating frequency is calculated as follows:

Min. Frequency=1/[(3.84 ns)×(2)]=130 Mhz        (B)

This significantly increases the operating frequency range of the delay line over the demonstrated prior method. Using the prior method would require an increase in the number of delay stages to between 19 and 20. Such an increase takes up valuable area and more importantly requires a redesign of the control logic controlling selection of the delay stages. The method of the present invention which increases delay in the non-uniform delay stages by adding buffers and/or internal loads is much more area-efficient and permits an architecture allowing for the re-use of existing control logic since the number of delay stages remains the same.

Alternative Embodiments

While embodiments and applications of this invention have been shown and described, it would be apparent to those skilled in the art having the benefit of this application that many more modifications than mentioned above are possible without departing from the inventive concepts herein. The invention, therefore, is not to be restricted except in the spirit of the appended claims.

What is claimed is:

1. A method of providing variable delay in a clock path, comprising:

linking two or more delay stages together as a delay line, wherein each of said two or more delay stages has a specified propagation delay, said delay line has a first end, a second end, and a center, and said two or more delay stages, taken as a group, exhibit two or more propagation delays ranging from a minimum to a maximum;

arranging said two or more delay stages within said delay line such that delay stages having the minimum propagation delay are in the center of said delay line, delay stages having the maximum propagation delay are at the ends of said delay line, and delay stages between the center and the ends of said delay line are chosen to exhibit increasingly higher propagation delays towards the ends of said delay line; and selecting a number of said two or more delay stages within said clock path using a selection control.

2. The method as recited in claim 1, wherein said delay line comprises sixteen delay stages.

3. The method as recited in claim 2, wherein said sixteen delay stages comprise six different types of delay stages wherein each type of delay stage exhibits a different propagation delay with increased propagation delay from a minimum for type one delay stages through a maximum for type six delay stages.

4. The method as recited in claim 3, wherein said sixteen delay stages comprise six type one delay stages and ten delay stages selected from type two through type six, wherein said type one delay stages are located three on either side of the center of said delay line and said ten delay stages selected from type two through type six are located extending away from said type one delay stages toward the ends of said delay line in order of increasing propagation delay, with five of said ten delay stages selected from type two through type six on either side of said type one delay stages.

5. The method as recited in claim 4, wherein said step, of selecting results in at least all of said type one delay stages being within said clock path.

6. A delay line which provides variable delay in a clock path, said delay line having a first end, a second end, and a center, the delay line comprising:

two or more delay stages linked together, each of said two or more delay stages having a specified propagation delay, said two or more delay stages, taken as a group, exhibiting two or more propagation delays ranging from a minimum to a maximum, and said two or more delay stages being arranged within said delay line such that delay stages having the minimum propagation delay are in the center of said delay line, delay stages having the maximum propagation delay are at the ends of said delay line, and delay stages between the center and the ends of said delay line are chosen to exhibit increasingly higher propagation delays towards the ends of said delay line; and a selection control for selecting a number of said two or more delay stages within said clock path.

7. The delay line as recited in claim 6, wherein said delay line comprises sixteen delay stages.

8. The delay line as recited in claim 7, wherein said sixteen delay stages comprise six different types of delay stages wherein each type of delay stage exhibits a different propagation delay with increased propagation delay from a minimum for type one delay stages through a maximum for type six delay stages.

9. The delay line as recited in claim 8, wherein said sixteen delay stages comprise six type one delay stages and ten delay stages selected from type two through type six, wherein said type one delay stages are located three on either side of the center of said delay line and said ten delay stages selected from type two through type six are located extending away from said type one delay stages toward the ends of said delay line in order of increasing propagation delay, with five of said ten delay stages selected from type two through type six on either side of said type one delay stages.

10. The delay line as recited in claim 9, wherein said selecting results in at least all of said type one delay stages being within said clock path.

* * * * *